United States Patent [19]

Okutsu et al.

[11] Patent Number: 4,967,100
[45] Date of Patent: Oct. 30, 1990

[54] CAPACITIVE LOAD DRIVING APPARATUS

[75] Inventors: Mitsuhiko Okutsu, Katsuta; Tadaaki Kariya, Ibaraki; Kouji Kawamoto, Hitachi; Syuzoh Kaneko, Hitachi; Yasuhiro Mashiko, Hitachi, all of Japan

[73] Assignees: Hitachi, Ltd., Tokyo; Hitachi Engineering Co., Ltd., Hitachi, both of Japan

[21] Appl. No.: 286,861

[22] Filed: Dec. 20, 1988

[30] Foreign Application Priority Data

Dec. 21, 1987 [JP] Japan .............................. 62-321560

[51] Int. Cl.$^5$ ........................... H03K 3/02; H03K 3/26
[52] U.S. Cl. .................................... 307/270; 307/246; 307/570; 307/242
[58] Field of Search ............... 307/270, 570, 466, 262, 307/246, 241, 242

[56] References Cited

U.S. PATENT DOCUMENTS

| | | | |
|---|---|---|---|
| 3,751,682 | 8/1973 | Howe | 307/262 |
| 3,914,628 | 10/1975 | Pao et al. | 307/262 |
| 4,733,106 | 3/1988 | Okutsu et al. | 307/270 |

Primary Examiner—Timothy P. Callahan
Attorney, Agent, or Firm—Antonelli, Terry, Stout & Kraus

[57] ABSTRACT

A capacitive load driving apparatus which has a plurality of first switching elements connected between a plurality of parallel loads and a first power source terminal for switching currents which charge the loads. There is furthermore provided a plurality of bipolar transistors connected between connecting points (of the first switching elements and the loads) and a second power source terminal for discharging charges stored in the loads and a plurality of second switching elements connected between a third power source terminal and bases of the bipolar transistor, respectively, for switching base currents supplied from the third power source terminal to the bipolar transistors. In addition, the capacitive load driving apparatus has a logic circuit connected to an input terminal for providing driving signals which turn off selectively one or all of the second switching elements in accordance with a signal from the input terminal, and it has a resistor connected between the third power source terminal and the second switching elements.

5 Claims, 3 Drawing Sheets

CAPACITIVE LOAD DRIVING APPARATUS

BACKGROUND OF THE INVENTION

The present invention generally relates to a capacitive load driving apparatus and, more particularly, relates to an apparatus for driving capacitive loads operated at a high voltage and arranged in a matrix.

A circuit for driving a capacitive load is generally constituted by a source side switch for charging the load and a sink side switch for discharging the charged load. As the prior art relating to such a capacitive load driving circuit, known is a technique disclosed, for example, in Japanese Patent Unexamined Nos. 60-208119, 58-221517, etc. To drive a capacitive load, generally, it is preferable to apply a rapid rise pulse as described. For example, in the above Japanese Patent Unexamined No. 58-221517, and to this end, a driving circuit having a large current driving capability is required. In the driving circuit disclosed for this purpose in the above Japanese Patent Unexamined Nos. 58-221517 and 60-208119, a thyristor is used as the source side switch $S_p$. As the sink side switch, on the other hand, a bipolar transistor is widely used.

Examples of a capacitive matrix load include an EL panel, and so on. An EL panel is driven with AC power because it initiates light emission at a high voltage of about 200 V, and it has a polarization effect. This point is described in detail, for example, in Japanese Patent Unexamined Nos. 52-123883 and in an article entitled "Bidirectional Push-Pull Symmetric Driving System of TF-EL Display", SHARP TECHNICAL JOURNAL, No. 38, pp. 61-65, 1987. In general, an EL panel is provided with scanning side electrodes to which a high voltage is successively and selectively applied and data side electrodes to which a relatively low voltage is applied in accordance with light-emission and non-light-emission data and in synchronism with the application of the high voltage to the scanning side electrodes, those scanning side electrodes and data side electrodes being arranged to intersect each other and to form an EL layer therebetween. Each of the portions enclosed by those scanning side electrodes and data side electrodes forms one unit picture element which is a capacitive load equivalently.

A problem has been newly found which is caused, as follows, when the scanning side electrodes in a capacitive matrix load is driven by use of such a driving circuit as disclosed in the above Japanese Patent Unexamined Nos. 58-221517 and 60-208119.

That is, with the tendency to make an EL panel large-scaled, it has become preferable to enlarge the current driving capability of a driving circuit. In this regard, in the conventional driving circuit, there is a possibility that a transistor acting as a sink side switch deviates from an area of safe operation (hereinafter abbreviated to "ASO") when a picture element is discharged after it has been charged with a positive high voltage $V_{HP}$, because a discharge current of the picture element is begun to flow in the condition that the positive high voltage $V_{HP}$ is being applied to the collector of the transistor. To prevent this phenomenon, it is necessary to restrict the discharge current by any means. When a picture element selected by the sink side switch is charged with a negative high voltage $V_{HN}$, on the other hand, the absolute value of the negative high voltage $V_{HN}$, that is $|V_{HN}|$, is smaller than the value of the positive high voltage $V_{HP}$, and when the picture element emits light, the voltage is borne by the picture element side. Accordingly, the problem with respect to the ASO is reduced, and a large current driving capability is thereby required in order to obtain luminous operation. That is, the requirement to the sink side switch is reverse to that in the case where the picture element is charged with the positive high voltage $V_{HP}$. In order to satisfy those opposing requirements, it is necessary to make the transistor acting as the sink side switch large-scaled. To make the transistor large-scaled is not preferable because the area of a chip becomes large in size when the driving circuit is made in the form of an integrated circuit.

SUMMARY OF THE INVENTION

It is therefore an object of the present invention to provide an improved capacitive load driving apparatus in which the foregoing problems are solved.

In more particularly, it is another object of the present invention to provide a capacitive load driving apparatus in which transistors acting as the sink side siwtches have a sufficiently large current driving capability while securing their operation within the ASO.

In order to attain the above objects, the capacitive load driving apparatus according to the present invention is provided with means for reducing the respective base currents of the transistors acting as the sink side switches in the condition where the ASO becomes a problem and for increasing the respective base currents of the same transistors in the condition where a large current driving capability is required.

More specifically, the capacitive load driving apparatus according to the present invention comprises: a first power source terminal; a second power source terminal; a third power source terminal; a plurality of output terminals connected to capacitive loads, respectively; a plurality of first switching elements respectively connected between the first power source terminal and the plurality of output terminals; a plurality of transistors respectively connected between the second power source terminal and the plurality of output terminals with their emitters commonly connected to the second power source terminal and collectors connected to the output terminals, respectively; a plurality of second switching elements respectively connected between the third power source terminal and respective base of the plurality of transistors; and means for making providing a base current to be supplied to each of the transistors (when all of the plurality of transistors are to be turned on smaller than a base current to be supplied to a selected one) of the plurality of transistors when a selected one of the transistors is to be turned on.

As a preferable specific example, the means for changing the base current of the transistor may be a resistor connected between the third power source terminal and the second switching elements.

As another preferable specific example, the means for changing the base current of the transistor may include a plurality of third switching elements respectively parallelly connected to the plurality of second switching elements, the third switching elements being different in current capacity from the second switching elements, the parallelly connected second and third switching elements being selectively turned on.

DESCRIPTION OF THE PREFERRED EMBODIMENTS

Referring to the accompanying drawings, embodiments of the capacitive load driving apparatus according to the present invention will be described in detail hereunder.

Figure 1:
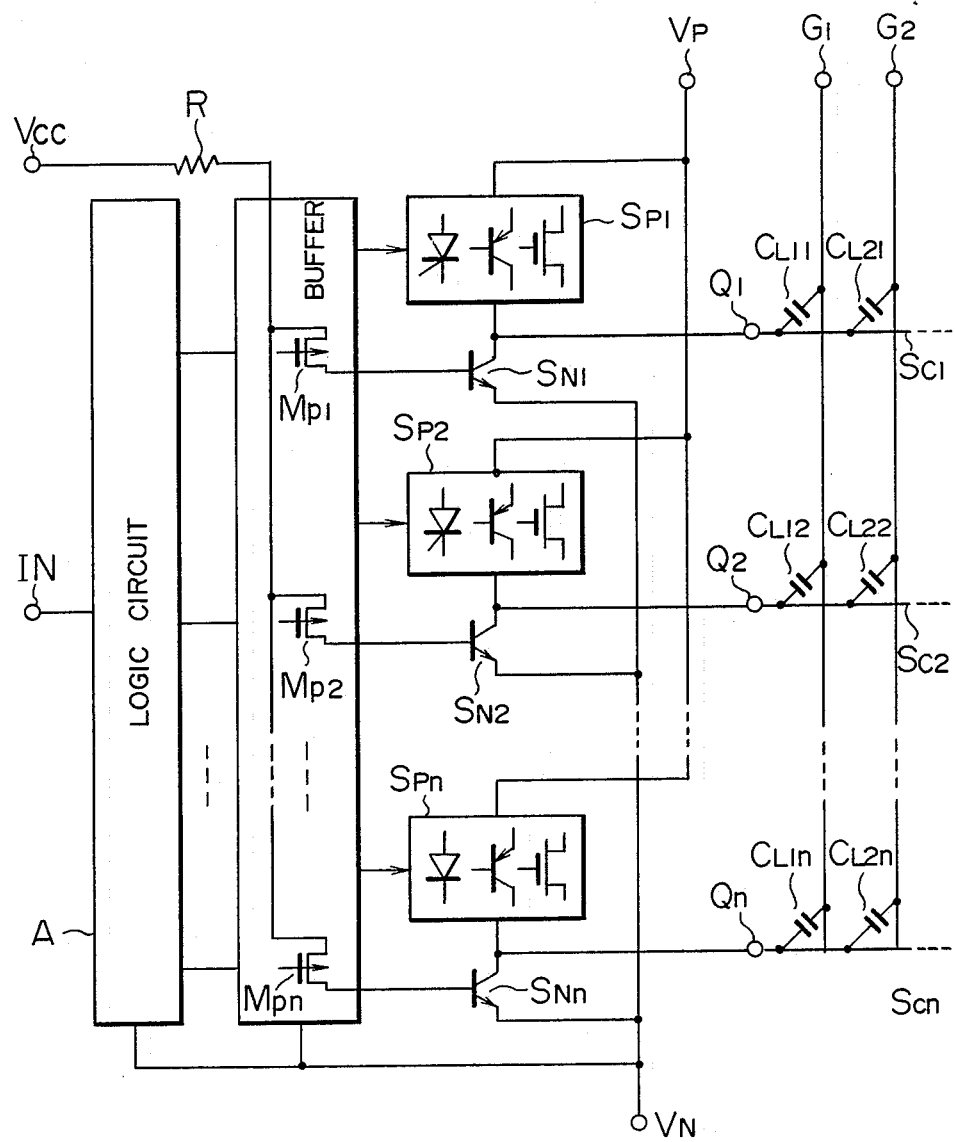
FIG. 1 is a schematic circuit diagram showing an embodiment of the capacitive load driving apparatus according to the present invention.

FIG. 1 shows a first embodiment in which the present invention is applied to a capacitive matrix load driving apparatus. In the drawings, the capacitive matrix load driving apparatus is provided with; a first power source terminal $V_P$; a second power source terminal $V_N$; a third power source terminal $V_{cc}$; an input terminal IN; a plurality of output terminals $Q_1$, $Q_2$, ..., and $Q_n$; a plurality of source side switches $S_{p1}$, $S_{p2}$, ..., and $S_{pn}$; a plurality of sink side switches $S_{N1}$, $S_{N2}$, ..., and $S_{Nn}$ respectively constituted by NPN transistors with their collectors connected to the output terminals $Q_1$, $Q_2$, ..., and $Q_n$, respectively, and with their emitters commonly connected to the second power source terminal $V_N$; a logic circuit A for processing an input signal from the input terminal IN; and a buffer circuit B for driving the source side switches $S_{p1}$, $S_{p2}$, ..., and $S_{pn}$ and the sink side switches $S_{N1}$, $S_{N2}$, ..., and $S_{Nn}$ in accordance with the output of the logic circuit A. The power for energizing the logic circuit A and the buffer circuit B is supplied from the third power source terminal $V_{cc}$. The buffer circuit B includes therein P-MOS transistors $M_{p1}$, $M_{p2}$, ..., and $M_{pn}$ with their sources commonly connected to the third power source terminal $V_{cc}$ through a resistor R and with their drains connected to the respective bases of the sink side switches $S_{N1}$, $S_{N2}$, ..., and $S_{Nn}$. Further, the buffer circuit B includes means for driving the source side switches $S_{p1}$, $S_{p2}$, ..., and $S_{pn}$. Scanning electrodes $S_{c1}$, $S_{c2}$, ..., and $S_{cn}$ are connected to the respective output terminals $Q_1$, $Q_2$, ..., and $Q_n$, and data electrodes $G_1$, $G_2$, ..., and $G_n$ are arranged perpendicularly to the scanning electrodes $S_{c1}$, $S_{c2}$, ..., and $S_{cn}$. Capacitive loads $C_{L21}$, $C_{L22}$, ..., $C_{L2n}$ are arranged in the form of a matrix at respective points of intersection of the scanning electrodes $S_{c1}$, $S_{c2}$, ..., and $S_{cn}$ and the data electrodes $G_1$, $G_2$, .... The capacitive loads $C_{L21}$, $C_{L22}$, ..., and $C_{L2n}$ constitute, for example, respective picture elements of an EL panel.

Next, the operation of the capacitive load driving apparatus as shown in FIG. 1 will be explained.

Assume now that the first power source terminal $V_P$ and the second power source terminal $V_N$ are being biased to a positive high voltage $V_{HP}$ and 0 (V), respectively, and that either a positive voltage $V_0$ or a low voltage 0 (V) is applied to the data electrodes $G_1$, $G_2$, ..., in accordance with luminous data. The positive high voltage $V_{HP}$ and the positive voltage $V_D$ are selected so as to be sufficiently higher and sufficiently lower than a light-emission initiating voltage $V_r$ of the EL panel respectively, and they are selected so as to satisfy the relation $|V_{HP} - V_D| < |V_r|$. In the above conditions, if the scanning electrodes $S_{c1}$, connected to the output terminal $Q_1$, is selected to be driven, only the source side switch $S_{p1}$ of the source side switches $S_{p1}$, $S_{p2}$, ..., and $S_{pn}$ is turned on (the transistor $S_{N1}$ acting as the sink side switch is therefore turned off), and the transistors $S_{N2} - S_{Nn}$ acting as the sink side switches are turned on. The turning-on of the source side switch $S_{p1}$ and the transistors $S_{N2} - S_{Nn}$ is carried out by a turn-on signal supplied from the buffer circuit B. Specifically, the turning-on of the NPN transistors $S_{N2} - S_{Nn}$ is carried out by the respective base currents supplied from the third power source $V_{cc}$ through the P-MOS transistors $M_{p2}$, ..., and $M_{pn}$ which are in the on-state. Substantially, the positive high voltage $V_{HP}$ is provided at the output terminal $Q_1$ which has been selected by the turn-on of the source side switch $S_{p1}$ and the transistors $S_{N2} - S_{Nn}$ acting as the sink side switches, while about 0 (V) is provided at each of the output terminals $Q_2 - Q_n$ which have not been selected by the turn-on of the source side switch $S_{p1}$ and the transistors $S_{N2} - S_{Nn}$ acting as the sink side switches. In the case where the load (that is, the picture element) $C_{L11}$ is to be driven so as to emit light, and the load (that is, the picture element) $C_{L21}$ element is to be driven so as not to emit light, the data electrodes $G_1$ and $G_2$ are biased to 0 (V) and the positive voltage $V_D$, respectively. Accordingly, the voltage across the load $C_{L11}$ exceeds the light-emission initiating voltage $V_r$ to make the load $C_{L11}$ emit light. Although the load or picture element $C_{L21}$ exists on the same selected scanning electrode $S_{c1}$, the load or picture element $C_{L21}$ does not emit light because the voltage across the load or picture element $C_{L21}$ achieves a voltage $|V_{HP} - V_D|$ which, as was discussed earlier, is less than the light-emission initiating voltage $V_r$. Further, all the loads or picture elements on the non-selected scanning electrodes do not emit light because the voltage across each of those loads or picture elements is 0 (V) or $|V_D|$ and therefore does not reach the light-emission initiating voltage $V_r$.

After completion of light emission of the loads or picture elements connected to the selected scanning electrode $S_{c1}$, the loads or picture elements are discharged. The discharge is carried out by turning-on the transistor $S_{N1}$ acting as a sink side switch and turning-off the source side switch $S_{p1}$ to thereby extract currents from the respective loads or picture elements $C_{L11}$, $C_{L21}$, .... At that time, it is not necessary to change the state of the other output terminals $Q_2 - Q_n$ and therefore all the transistors $S_{N1} - S_{Nn}$, acting as sink side switches, are controlled to turn on. After completion of discharge of the loads or picture elements connected to the scanning electrodes $S_{c1}$, the scanning electrode $S_{c2}$ connected to the next output terminal $Q_2$ is selected and thereafter the same operation as that upon selection of the output terminal $Q_1$ is successively repeated.

After completion of the foregoing operation on all the scanning electrodes, the selection is made to come back to the first scanning electrode, that is, the first output terminal $Q_1$. However, since the EL panel has a polarization effect, it is necessary to apply a voltage of a polarity opposite to that of the voltage applied during the previous successive driving operation to the loads or picture elements in order to make the loads or picture elements emit light with the same level as that which resulted in light emission during the previous driving operation. Accordingly, in the operation at this time, the second and first power source terminals $V_N$ and $V_P$ are biased to the negative high voltage $V_{HN}$ and 0 (V), respectively, the transistor $S_{N1}$ acting, as the sink side switch, connected to the selected output terminal $Q_1$ is turned on and the source side switches $S_{p2}-S_{pn}$ respectively connected to the non-selected outputs $Q_2-Q_n$ are turned off, so that the negative high voltage $V_{HN}$ is provided at the selected output terminal $Q_1$ and 0 (V) is provided at the non-selected outputs $Q_2-Q_n$. The negative high voltage $V_{HN}$ is established so as to satisfy the conditions $|V_{HN}|<|V_r|$ and $|V_{HN}|+|V_D|>|V_r|$. Assume now that the positive voltage $V_D$ and 0 (V) are being applied to the data electrodes $G_1$ and $G_2$, respectively. Then the voltage across the load or picture element $C_{L11}$ on the selected scanning electrode becomes $|V_{HN}|+|V_D|$ so as to exceed the light-emission initiating voltage $V_r$ to thereby make the load or picture element $C_{L11}$ emit light, while the load or picture element $C_{L21}$ does not emit light because the voltage across the load or picture element $C_{L21}$ is $|V_{HN}|$ and does not reach the light-emission initiating voltage $V_r$. Further, all the loads or picture elements on the non-selected scanning electrodes do not emit light because the voltage across each of those loads or picture elements if 0 (V) or $|V_D|$ and therefore does not reach the light-emission initiating voltage $V_r$.

After completion of light emission of the loads or picture elementes on the selected scanning electrode, it is necessary to discharge the loads or picture elements in the same manner as in the last time, in this case, however, the discharge is carried out by turning-on the source side switch $S_{p1}$ so as to make currents flow into the respective loads or picture elements respectively. At this time, it is not necessary to change the state of the non-selected output terminals $Q_2-Q_n$ and therefore all the source side switching $S_{p1}-S_{pn}$ are turned on. After completion of the foregoing discharge, the next scanning electrode, that is, the next output terminal $Q_2$ is selected and thereafter the same operation as that upon selection of the output terminal $Q_1$ is successively repeated. After completion of the foregoing operation on the last scanning electrode, that is, the last output terminal $Q_n$, the operation is returned to the previous initial state.

Further, in the foregoing operations, a voltage of a low power source is always applied to the third power source terminal $V_{cc}$ with the second power source terminal $V_N$ acting as a reference.

Next, in the foregoing operations, the operation and effect of the resistor R connected between the third power source terminal $V_{cc}$ and the buffer circuit B will be described.

Now, let us consider the case where loads or picture elements connected to a selected one of the output terminals (for example, the loads or picture elements $C_{L11}$, $C_{L21}$, ..., which the output terminal $Q_1$ is selected) are charged with the positive high voltage and then the NPN transistors acting as the sink side switches are turned on to discharge the charged loads or picture elements. At this time, as described above in the explanation of the operations, all the NPN transistors $S_{N1}-S_{Nn}$ are controlled to turn on. Let a base current for one NPN transistor be $I_B$, then a current of $I_B \times n$ flows in the resistor R so as to provide a voltage drop $\Delta V_R$ across the resistor R as expressed by the following equation:

$$\Delta V_R = (I_B \times n) \times R$$

where n represents the number of channels of the driving circuit and it represents the resistance value of the resistor R. Accordingly, the effective voltage $V_s$ applied to the respective sources of the P-MOS transistors $M_{P1}-M_{Pn}$ becomes $$V_s = V_{cc} - \Delta V_R$$

where $V_{cc}$ represents the voltage applied to the third power source terminal $V_{cc}$. The reduction of the source voltage lowers the gate-source voltage and source-drain voltage of each of the P-MOS transistors $M_{P1}-M_{Pn}$ so that the value of the base current of each of the NPN transistors $S_{N1}-S_{Nn}$ becomes low to thereby restrict the sink current corresponding to each of the NPN transistors $S_{N1}-S_{Nn}$.

In the case where the loads are driven with a negative voltage, one bipolar transistor (sink side) is made to turn on. At this time, the current flowing in the resistor R is $I_B$ and the voltage drop $\Delta V_R$ across the resistor R becomes $$\Delta V_R = I_B \times R$$

which is 1/n of that in the foregoing case where all the NPN transistors are turned on.

A numerical example will be described hereunder. For example, calculation will be made as to the case where $V_{cc}=5$ V, $I_B=200$ μA, R=300 Ω, and n=34 CH.

In the case of discharge operation where all the NPN transistors are turned on, the voltage drop $\Delta V_R$ across the resistor R is $\Delta V_R = 200(\mu A) \times 34 \times 300$ (Ω)=2.04 (V), and the effective source voltage of the P-MOS transistors $M_{P1}-M_{Pn}$ becomes $V_s=5$ $(V)-2.04$ $(V)=2.96$ (V). (In the actual case, the current $I_B$ per se becomes low to reduce the voltage drop $\Delta V_R$ across the resistor R so that the effective source voltage $V_s$ becomes stable at a value higher than 2.96 V calculated in the above numerical example).

In the case of negative-voltage drive where only one NPN transistor of one output terminal is turned on, the voltage drop $\Delta V_R$ across the resistor R is $$\Delta V_R = 200(\mu A) \times 300(\Omega) = 60(mV),$$

and the effective source voltage of the P-MOS transistors $M_{P1}-M_{Pn}$ becomes $$V_s = 5(V) - 60(mV) = 4.94(V),$$

so that the output current of the P-MOS transistor, that is, the base current for the NPN transistor, has a level which is little affected by the resistor R.

Figure 2:
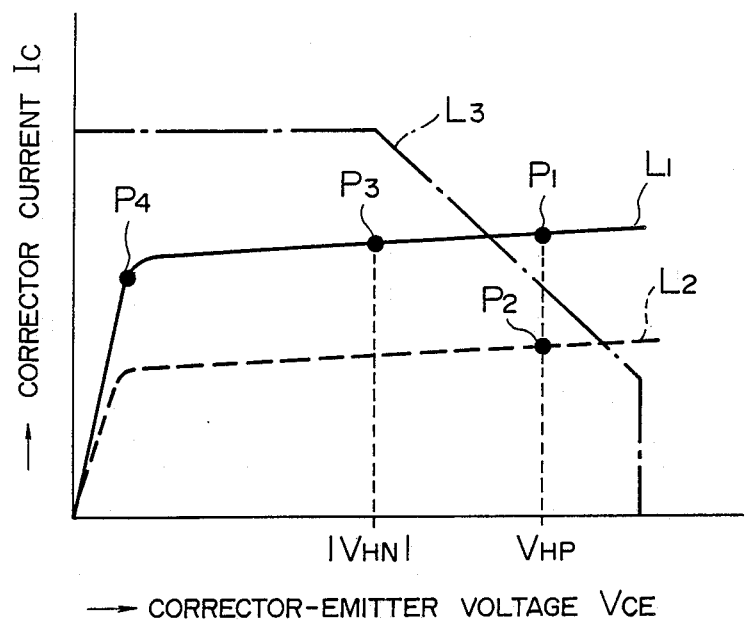
FIG. 2 is a diagram showing the relationship between the collector voltage and collector current of the transistor acting as a sink side switch for explaining the effect of the embodiment shown in FIG. 1.

According to the foregoing embodiment, when a load charged with a positive high voltage is discharged through an NPN transistor, that is, in the mode where the ASO of the NPN transistor becomes a problem, the sink current of the NPN transistor can be reduced, and in the negative-voltage driving mode where a large current driving capability is required on the other hand, the NPN transistor can be operated so that the sink current is not affected. This operation will be described with reference to FIG. 2. FIG. 2 shows a characteristic diagram showing the relationship of the collector current $I_C$ vs. collector-emitter voltage of the sink side NPN transistor. In the graph of FIG. 2, the curve $L_1$ shows the characteristic in the negative-voltage driving mode, that is, when one NPN transistor is operated and the curve $L_2$ shows the characteristic in the discharge mode where the loads charged to the positive high voltage are discharged, that is, in the condition that all the NPN transistors are turned on so that the base currents are reduced. Accordingly, the curve $L_2$ has a lower-current characteristic than that of the curve $L_1$. Further, the curve $L_3$ shows the ASO of the sink side NPN transistor. If the resistor R does not exists, the operating point at which the load charged to the positive high voltage is discharged through the NPN transistor comes to the point $P_1$ where the curve $L_1$ and the positive high voltage $V_{HP}$ intersect because the characteristic curve is $L_1$ in this case. In the case where the resistor R is provided, on the contrary, the above-mentioned operating point comes to the point $P_2$ which is the intersection of the curve $L_2$ and the positive high voltage $V_{HP}$ so that the sink side NPN transistor can be operated in the ASO. In the case where the picture elements are selectively charged to the negative high voltage $V_{HN}$ to emit light through the corresponding sink side NPN transistor, the $L_C$ vs. $L_{CE}$ characteristic becomes the curve $L_1$ so that the operation initiating point of the NPN transistor comes to the point $P_3$ where the curve $L_1$ and the absolute value of the negative high voltage $|V_{HN}|$ intersect so as to show a large current driving capability. When the picture element emits light, the greater part of the voltage is borne by the picture element side so that the operation point comes to the point $P_4$. As described above, according to this embodiment, it is possible to obtain sufficiently large current driving capability while securing the operation of the sink side NPN transistor within the ASO in the case of high voltage load driving. Further, according to this invention, the objects of the present invention can be attained by the provision of a resistor, so that when the driving apparatus is constituted by an integrated circuit, the degree of integration of the circuit can be improved effectively.

Figure 3:
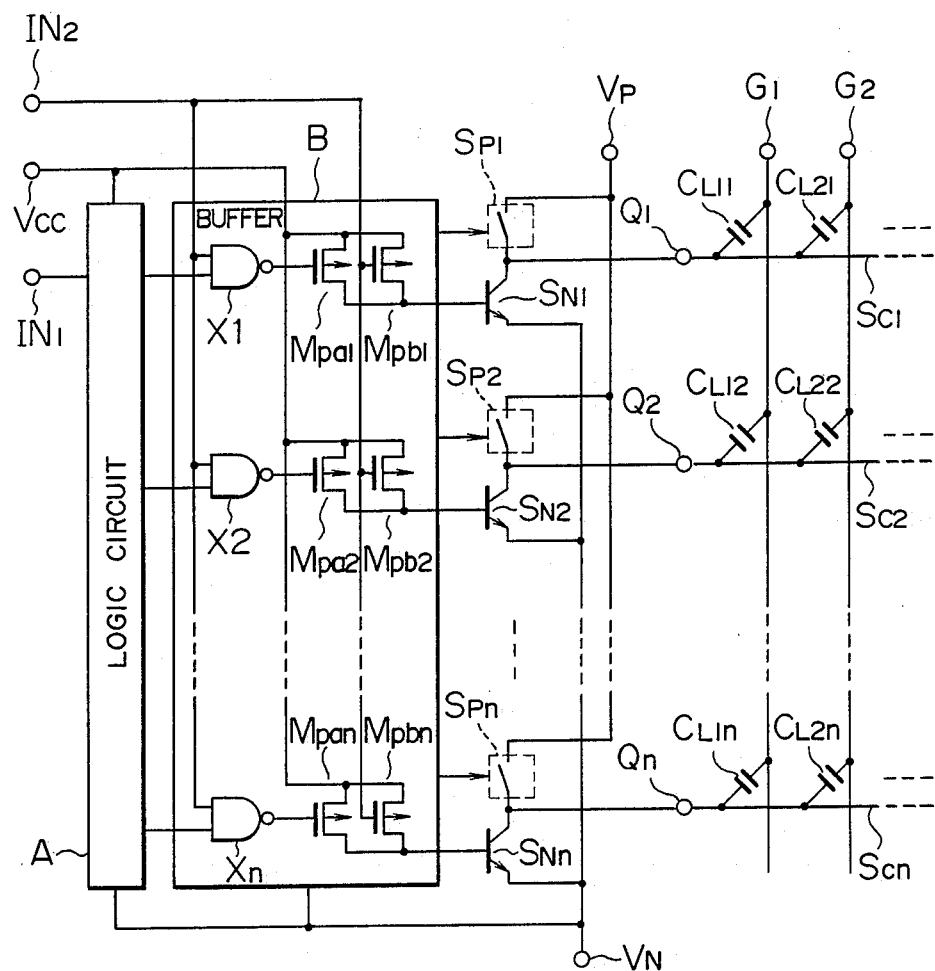
FIG. 3 is a schematic circuit diagram showing another embodiment of the capacitive load driving apparatus according to the present invention.

FIG. 3 illustrates a second embodiment in which the present invention is applied to a capacitive matrix load driving apparatus. The feature of the second embodiment is in that a parallel circuit of two MOS transistors different in current capacity from each other is connected between a third power source terminal $V_{cc}$ and the base of each of transistors $S_{N1}, S_{N2}, \ldots, S_{Nn}$ acting as the sink side switches and the two MOS transistors of each parallel circuit are selectively turned on. Specifically, as seen in FIG. 3, MOS transistors $M_{pa1}, M_{pa2}, \ldots, M_{pan}$ and $M_{pb1}, M_{pb2}, \ldots, M_{pbn}$ and NAND gates $X_1, X_2, \ldots, X_n$ are provided in a buffer circuit B. In each one of the pairs of P-MOS transistors $M_{pa1}$ and $M_{pb1}$, $M_{pa2}$ and $M_{pb2}, \ldots, M_{pan}$ and $P_{pbn}$, the two P-MOS transistors are connected in parallel to each other, and the parallel-connected pairs of the P-MOS transistors are commonly connected at their respective one ends to the third power source terminal $V_{cc}$ and respectively connected at their other ends to the respective bases of the transistors $S_{N1}, S_{N2}, \ldots, S_{Nn}$ acting as the sink side switches, in a manner so that the respective sources of the P-MOS transistors $M_{pa1}, M_{pa2}, \ldots, M_{pan}$ and $P_{pb1}, P_{pb2}, \ldots, M_{pbn}$ are commonly connected to the third power source terminal $V_{cc}$. The NAND gates $X_1, X_2, \ldots, X_n$ are arranged in a manner so that the two inputs of each of the NAND gates $X_1, X_2, \ldots, X_n$ are connected to a first input terminal $IN_1$ through a logic circuit A and to a second input terminal $IN_2$ directly, respectively, and the respective outputs of the NAND gates $X_1, X_2, \ldots, X_n$ are connected to the respective gates of the P-MOS transistors $M_{pa1}, M_{pa2}, \ldots,$ and $M_{pan}$. The respective gates of the P-MOS transistors $M_{pb1}, M_{pb2}, \ldots,$ and $M_{pbn}$ are commonly connected to the second input terminal $IN_2$. The logic circuit A is constituted by a shift register. The current capacity of each of the P-MOS $M_{pa1}, M_{pa2}, \ldots,$ and $M_{pan}$ is selected to be larger than that of each of the P-MOS transistors $M_{pb1}, M_{pb2}, \ldots,$ and $M_{pbn}$.

The operation of this embodiment will be described. Assume now that data of "High" are set only at the first bit of the shift register, that is, the bit of the shift register corresponding to an output terminal $Q_1$. In this condition, if an input signal of "High" is applied to the second input terminal $IN_2$, the output of the NAND gate $X_1$ becomes "Low" and the respective outputs of the remainder NAND gates $X_2-X_n$ become "High" so that the P-MOS transistor $M_{pa1}$ is turned on and the remainder P-MOS transistors $M_{pa2}-M_{pan}$ are turned off. On the other hand, all the P-MOS transistors $M_{pb1}, M_{pb2}, \ldots,$ and $M_{pbn}$ are in the off-state because the second input terminal $IN_2$ is "High". In this first mode, therefore, only the NPN transistor $S_{N1}$ is selectively driven to turn on by the P-MOS transistor $M_{pa1}$ in accordance with the data in the shift register.

If an input signal of "Low" is applied to the second input terminal $IN_2$, on the contrary, the respective outputs of all the NAND gate $X_1-X_n$ become "High" so that all the P-MOS transistors $M_{pa1}-M_{pan}$ are turned off. At this time, all the P-MOS transistors $M_{pb1}-M_{pbn}$ are in the on-state because the second input terminal $IN_2$ is "Low". In this second mode, therefore, all the transistors $S_{N1}, S_{N2}, \ldots, S_{Nn}$ acting as the sink side switches are driven to turn on.

The base current supplied to the transistor $S_{N1}$ from the P-MOS transistor $M_{pa1}$ in the first mode is larger than the base currents supplied to the respective transistors $S_{N1}, S_{N2}, \ldots, S_{Nn}$ from the respective P-MOS transistors $M_{pb1}, M_{pb2}, \ldots,$ and $M_{pbn}$ in the second mode, because the current capacity of each of the P-MOS transistors $M_{pa1}, M_{pa2}, \ldots,$ and $M_{pan}$ is selected to be larger than that of each of the P-MOS transistors $M_{pb1}, M_{pb2}, \ldots,$ and $M_{pbn}$. Accordingly, the same effect as that of the first embodiment can be obtained also in this second embodiment if the transistors $S_{N1}, S_{N2}, \ldots, S_{Nn}$ acting as the sink side switches are operated in the second mode when the picture elements are discharged and operated in the first mode when the picture elements are made to emit light. The second embodiment has an advantage in that even if a change occurs in the condition of the loads it is possible to perform control following the change, because the on/off of the P-MOS transistors $M_{pa1}-M_{pan}$ and $M_{pb1}-M_{pbn}$ can be controlled externally.

Although NPN transistors are used as the sink side switches in the foregoing first and second embodiments of the present invention, PNP transistors may be used in place of the NPN transistors, and the P-MOS transistors constituting the buffer circuit may be replaced by N-MOS transistors. Further, although the foregoing embodiments of the present invention have been described about the case where the present invention is applied to EL panel driving, the present invention may be applied to drive any kind of loads so long as the loads are necessary to be driven alternately bidirectionally, that is, in the positive and negative directions.

Further, as the source side switches in the foregoing embodiments, thyristors, bipolar transistors, or MOS transistors may be used as illustrated in FIG. 1. When MOS transistors are used, however, it is necessary to provide voltage-withstanding measures in the circuit for driving the MOS transistors.

As described above, according to the present invention, in the load driving circuit including a plurality of NPN transistors, the base current of each of the NPN transistors can be controlled in accordance with the mode, such as a case where only one of the NPN transistors is turned on, a case where all the NPN transistors are turned on, or the like. Accordingly, in the case where the driving circuit according to the present invention is applied to an EL panel, or the like, it is possible to reduce the respective base currents of the sink side NPN transistors so as to restrict the respective output currents of the NPN transistors, that is, the respective discharge currents of the loads or picture elements, to thereby make the NPN transistors operate surely within the ASO at the time of discharging the loads or picture elements, because in discharging the loads or picture elements the respective sink currents of the NPN transistors may be relatively small although a high voltage higher than the luminous threshold of the EL panel is applied to the NPN transistors. In the case of charging the loads or picture elements with a negative voltage, on the other hand, a large current driving capability is required although a voltage lower than the light-emission threshold is applied to the NPN transistors and therefore the operation of the NPN transistors may be sure in view of ASO in comparison with the case of discharging the NPN transistors. In this case, according to the present invention, it is possible to ensure the respective output currents of the NPN transistors without increasing or decreasing the respective base current of the NPN transistors.

Thus, according to the present invention, in the load driving apparatus having a plurality of NPN transistors, a sufficiently large current driving capability can be obtained while ensuring the operation of the NPN transistors within the ASO.

We claim:

1. A capacitive load driving apparatus comprising:
a first power source terminal;
a second power source terminal;
a third power source terminal;
an input terminal;
a plurality of output terminals connected to capacitive loads, respectively;
a plurality of first switching elements being coupled respectively between said first power source terminal and said plurality of output terminals;
a plurality of bipolar transistors being coupled respectively between said second power source terminal and said plurality of output terminals, emitters of said plurality of bipolar transistors being commonly connected and being coupled to said second power source terminal, collectors of said plurality of bipolar transistors being respectively coupled to said output terminals;
a plurality of second switching elements, each one thereof being respectively coupled between said third power source terminal and a base of a respective one of said plurality of bipolar transistors, wherein when a respective one of said plurality of second switching elements is turned ON, there is applied therethrough a base current signal to a corresponding one of said plurality of bipolar transistors in accordance with a potential being applied at said third power source terminal;
a logic circuit, coupled to said input terminal, for forming a driving signal which turns on selectively either one or all of said second switching elements in accordance with an input signal from said input terminal, wherein the selective turning ON of either one or all of said second switching elements correspondingly results in one or all of said plurality of bipolar transistors being selectively turned on in response to said driving signal being applied to a respective one or all of said second switching elements to which said plurality of bipolar transistors are correspondingly coupled to; and
means for providing a base current to be supplied in accordance with applying a potential to said third power terminal such that when a selection is made for one of said plurality of bipolar transistors to be turned ON, base current drive signal is provided for effecting said base current of a magnitude which is greater than that for providing the respective base currents to be supplied to each one of said plurality of bipolar transistors when all of said plurality of transistors are selected to be turned ON.

2. A capacitive load driving apparatus in accordance with claim 1, in which said means is a resistor connected between said third power source terminal and said second switching elements.

3. A capacitive load driving apparatus in accordance with claim 2, in which said first switching elements are selected from a group consisting of thyristors, bipolar transistors, and MOS transistors.

4. A capacitive load driving apparatus comprising:
a first power source terminal;
a second power source terminal;
a third power source terminal;
a first input terminal;
a second input terminal;
a plurality of output terminals connected to capacitive loads, respectively;
a plurality of first switching elements being coupled respectively between said first power source terminal and said plurality of output terminals;
a plurality of bipolar transistors being coupled respectively between said second power source terminal and said plurality of output terminals, emitters of said plurality of bipolar transistors being commonly connected and being coupled to said second power source terminal, collectors of said plurality of bipolar transistors being respectively coupled to said output terminals;
a plurality of second switching elements, each one thereof being respectively coupled between said third power source terminal and a base of a respective one of said plurality of bipolar transistors, wherein when a respective one of said plurality of second switching elements is turned ON, there is applied therethrough a base current signal to a corresponding one of said plurality of bipolar transistors in accordance with a potential being applied at said third power source terminal;
a logic circuit, coupled to said input terminal, for forming a driving signal which turns on selectively one of said second switching elements in accordance with an input signal from said input terminal, wherein a respective one of said bipolar transistors is selectively turned on in response to said driving signal being applied to a respective one of said second switching element to which it is correspondingly coupled to; and a plurality of third switching elements respectively connected in parallel to respective ones of said second switching elements, each of said third switching element has a relatively lower current carrying capacity than that of each of said second switching elements, wherein each respective third switching element is turned on when a corresponding one of said plurality of second switching elements to which it is connected in parallel with is turned off by an input signal from said second input terminal.

5. A capacitive load driving apparatus in accordance with claim 4, in which said first switching elements are selected from the group consisting of thyristors, bipolar transistors, and MOS transistors.

* * * * *